United States Patent [19]

Saka et al.

[11] 4,450,584
[45] May 22, 1984

[54] MICROWAVE INTEGRATED CIRCUIT MIXER

[75] Inventors: Hiroshi Saka, Kyoto; Toshihide Tanaka, Ikoma, both of Japan

[73] Assignee: Matsushita Electric Industrial Co., Ltd., Kadoma, Japan

[21] Appl. No.: 392,158

[22] Filed: Jun. 25, 1982

[30] Foreign Application Priority Data

Jun. 30, 1981 [JP] Japan .................. 56-102830
Jun. 30, 1981 [JP] Japan .................. 56-102842

[51] Int. Cl.³ ............................................. H04B 1/26
[52] U.S. Cl. ...................................... 455/325; 455/330
[58] Field of Search .............................. 455/325–327, 455/330, 331

[56] References Cited

U.S. PATENT DOCUMENTS

| | | | |
|---|---|---|---|
| 3,870,960 | 3/1975 | Hallford et al. | 455/327 |
| 4,249,263 | 2/1981 | Shinkawa et al. | 455/330 |
| 4,384,367 | 5/1983 | King et al. | 455/325 |

FOREIGN PATENT DOCUMENTS

| | | | |
|---|---|---|---|
| 2921790 | 1/1980 | Fed. Rep. of Germany | 455/325 |
| 57-80809 | 5/1982 | Japan | 455/330 |
| 0593298 | 2/1978 | U.S.S.R. | 455/325 |

Primary Examiner—Marc E. Bookbinder
Attorney, Agent, or Firm—Stevens, Davis, Miller & Mosher

[57] ABSTRACT

In a mixer using a planar circuit such as a strip line or a microstrip line etc., an IF signal interruption circuit which passes an RF signal but exhibits an open-circuit impedance against an IF signal is provided in shunt with a main line on which the RF signal propagates toward a mixer diode, and a low-pass filter is connected in the vicinity of the IF signal interruption circuit in order to short-circuit a mount point of the diode for the IF signal by high frequency short-circuiting technique wherein an open-ended quarter-wavelength transmission line or a short-circuited half-wavelength transmission line is used, whereby low noise performance can be obtained over a wide frequency band even under such an operating condition that the IF signal is in the GHz band.

9 Claims, 7 Drawing Figures

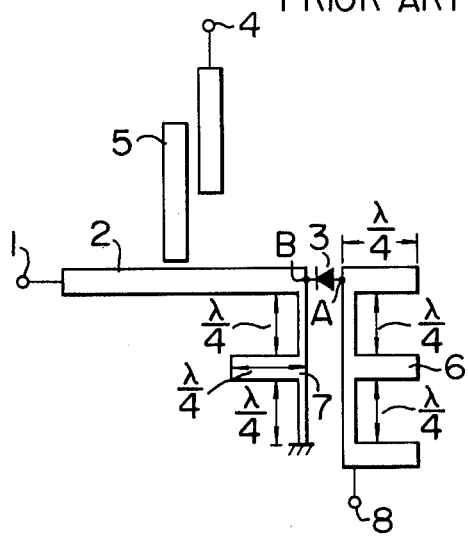
FIG. 1 PRIOR ART
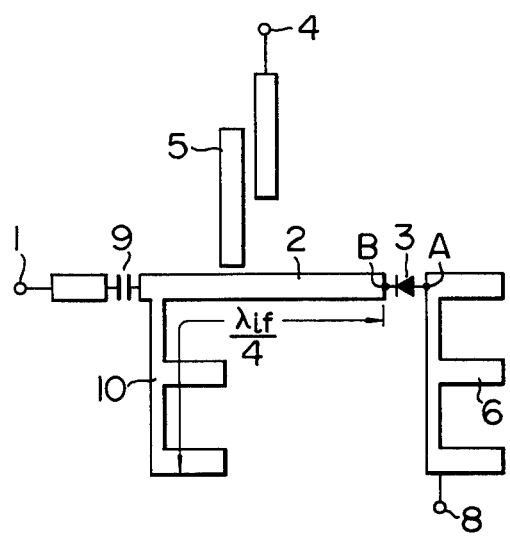
FIG. 2
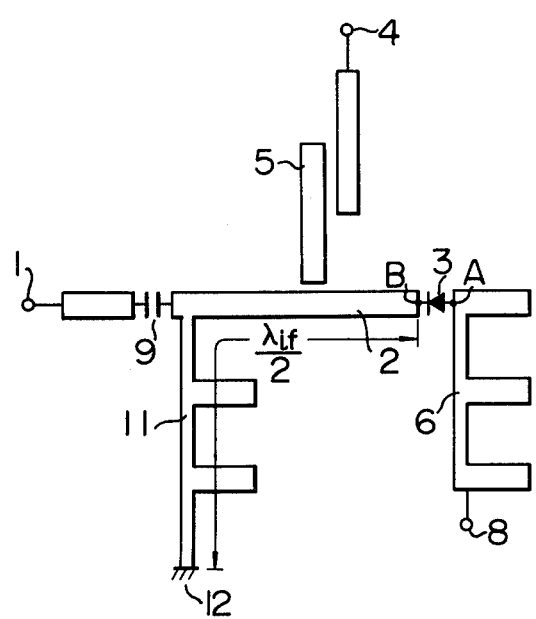
FIG. 3
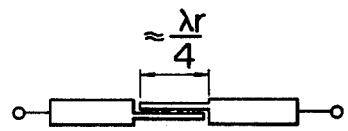
FIG. 4A
FIG. 4B

MICROWAVE INTEGRATED CIRCUIT MIXER

This invention relates to a microwave integrated circuit mixer (MIC mixer) using a strip-line or a micro-strip line, etc.

In a microwave receiver such as an SHF television receiver, the radio frequency (RF) input signal in the microwave region is converted to an intermediate frequency (IF) signal with a frequency much lower than that of the RF input signal. In a mixer which performs the frequency conversion, the RF input signal and a local oscillator (LO) signal are supplied to a mixer diode, to one end of which a low-pass filter is connected, and the IF signal with a frequency equal to the difference between the frequencies of the RF input signal and the LO signal is taken from the low-pass filter. In order to obtain the IF signal efficiently through the low-pass filter, it is necessary that the other end of the mixer diode is short-circuited at the intermediate frequency.

In the conventional MIC mixer, as a method for short-circuiting the mount point of the diode at the frequency of the IF signal, a low-pass filter, one end of which is short-circuited to a ground, is connected in the vicinity of the mixer diode. The fact that the impedance of this low-pass filter shows nearly short-circuit characteristics at lower frequencies is utilized in order for short-circuiting the mount point of the diode at such an intermediate frequency.

In FIG. 1, an RF signal introduced to a terminal 1 propagates through a main line 2 and is then supplied to a mixer diode 3. An LO signal injected via a terminal 4 is applied to a mixer diode 3 after passing through a band-pass filter (BPF) for the LO signal (i.e., LO-BPF) 5 which is coupled to the main line 2 at the respective high frequencies and passes only the LO signal selectively. 6 denotes a low-pass filter which takes out an IF signal with a frequency equal to a difference between the frequencies of the RF input signal and the LO signal and short-circuits the terminal A of the mixer diode 3 at both frequencies of the RF input signal and the LO signal by high frequency short-circuiting technique where a quarter-wavelength transmission line is used. The low-pass filter 6 is constituted with open-ended stubs (i.e., those having an open-ended terminal and hereinafter such a stub is called "open-ended stub") which have a length ($\lambda/4$) approximately equal to the ¼ wavelength of the RF signal and the LO signal, and with series inductances. 7 is an IF short-circuiting circuit for short-circuiting the IF signal at a terminal B of the mixer diode 3, and is constituted with a ¼ wavelength ($\lambda/4$) line having a higher characteristic impedance and with a ¼ wavelength open-ended stub having a lower characteristic impedance. This circuit 7 is a low-pass filter with one end terminal thereof short-circuited to a ground. 8 is an IF signal output terminal from which the IF signal generated by the mixer diode 3 is derived.

Such a prior art IF signal short-circuiting circuit 7 composed of a low-pass filter with its end terminal short-circuited to a ground has no problem when the IF is relatively low. However, accordingly as this frequency increases, the impedance of the IF signal short-circuiting circuit 7 becomes no longer negligible, and hence the circuit 7 can not be considered as a short circuit. That is, the impedance of the circuit 7 exhibits the characteristics of an inductive reactance circuit having a finite impedance. Since the circuit 7 is provided in series with the mixer diode 3 when looked into the mixer diode 3 from the terminal 8, the matching band-width for the IF signal is narrowed as the impedance of the circuit 7 increases. As a result, the band-width of the mixer becomes limited. At the same time, since the main line 2 is connected to the terminal B of the diode 3, if the impedance of the circuit 7 increases, the output impedance seen from the output terminal 8 of the IF signal toward the mixer diode 3 is considerably influenced depending on the state of a circuit connected to the side of the terminal 1 of the main line 2. This has caused a defect of decreasing the performance or efficiency of the mixer due to a mismatching of the output impedance with respect to the IF signal.

In order to eliminate the defects by decreasing the impedance of the circuit 7, several methods have been conventionally considered such as decreasing the size of the circuit 7 or lowering a characteristic impedance of a series strip line which constitutes the circuit 7. However, if the size is reduced or characteristic impedance is lowered until the impedance of the circuit 7 becomes nearly negligible, a new problem arises because the IF signal short-circuiting circuit 7 disturbs largely the line impedance of the main line 2 whereby the propagation of the RF signal is disturbed largely.

This invention aims to remove these shortcomings of the prior art and to provide a mixer capable of obtaining low noise performance over a wide frequency range. Namely, according to this invention, an intermediate frequency (IF) signal interruption circuit which passes the RF signal but presents an open circuit to the IF signal is provided on the main line connecting the RF signal input terminal to one end of the mixer-diode, and a part of the main line is utilized to short-circuit the mount point of the mixer diode by a high frequency short-circuiting technique. In this manner, even if the frequency of the IF signal is high, the mount point of the mixer diode can be securely short-circuited at the intermediate frequency.

BRIEF DESCRIPTION OF THE FIGURES

The present invention will be made more apparent from the following detailed description taken in conjunction with the accompanying drawings, in which:

FIG. 1 is a pattern diagram of a prior art mixer using MIC.

FIG. 2 is a pattern diagram of a mixer according to this invention.

FIG. 3 is a pattern diagram of a mixer according to another embodiment of this invention.

FIGS. 4A and 4B are pattern diagrams showing concrete constitutions of the IF signal interruption circuits used in the embodiments of FIGS. 2 and 3.

DETAILED DESCRIPTION OF THE INVENTION

Figure 5:
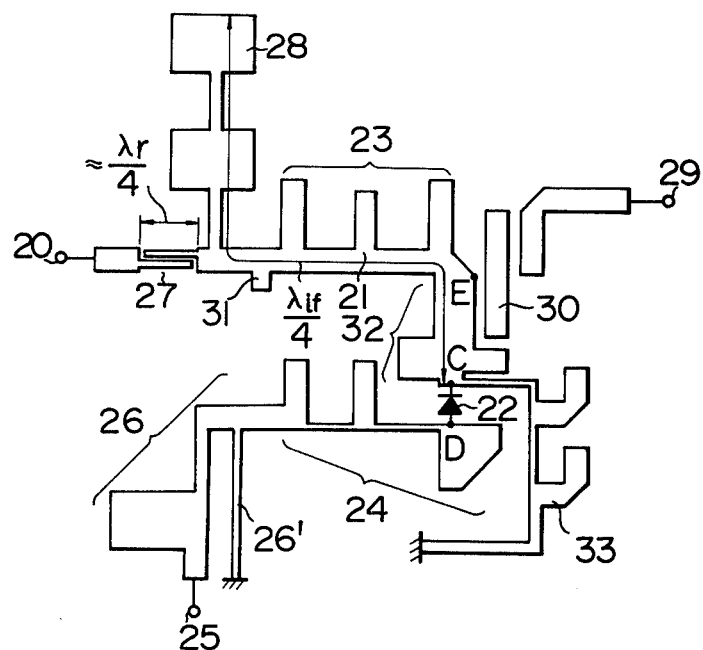
FIG. 5 is a pattern diagram of a mixer according to a further embodiment of this invention.

Embodiments of this invention will be explained hereinafter. FIG. 2 shows one embodiment of this invention, where like reference numerals are used to denote like parts as shown in FIG. 1. In FIG. 2, the RF input signal introduced to a terminal 1 propagates on a main line 2 and is applied to a mixer diode 3. An LO signal entering a terminal 4 is applied to the mixer diode 3 after passing through an LO-BPF 5 which is coupled with the main line 2 at the respective high frequencies and passes only the LO signal selectively. 6 denotes a low-pass filter which takes out an IF signal and short-circuits a terminal A of the diode 3 at both frequencies of the RF signal and the LO signal by a high frequency shorting technique. Namely the filter is constituted with open-ended stubs with a length equal to the ¼ wavelength (λ/4) of the RF signal and the LO signal and with series inductance. 8 is an IF signal output terminal from which the IF signal generated by the mixer diode 3 is derived. 9 is an IF signal interruption circuit which passes the RF signal but presents an open circuit to IF signal. An open-ended low-pass filter 10 is connected in shunt with the main line 2 in the vicinity of this IF signal interruption circuit 9. The line length between the open end of the low-pass filter 10 and the mixer diode 3 is selected to be equal to the ¼ wavelength (λif/4) of the IF signal.

In the embodiment of FIG. 2, since the IF signal interruption circuit 9 exhibits an open-circuit impedance against the IF signal and the line length between the mixer diode 3 and the open-end of the low-pass filter 10 is selected to be equal to the ¼ wavelength (λif/4) of the IF signal, the terminal B of the mixer diode 3 is short-circuited for the IF signal. Therefore, even if the frequency of the IF signal is in the GHz range or as high as 1 GHz, the mount point of the diode can be short-circuited securely for the IF signal. Furthermore, since the IF signal interruption circuit 9 is provided in series with the main line 2, the influence of a circuit connected to the terminal 1 upon the short-circuiting state of the mount point B of the diode can be removed.

Furthermore, especially in the case that the intermediate frequency is low, the realization of a short-circuiting state of the diode mount point B at the intermediate frequency becomes possible by varying the electrical length of the open-ended low-pass filter 10, while keeping the line length of the main line 2 as short as possible in order to minimize the transmission loss of the main line 2 for the RF signal.

FIG. 3 shows another embodiment of this invention. Like reference numerals are used to denote like parts shown in FIG. 2. In FIG. 3, a reference numeral 11 denotes a low-pass filter, one end terminal of which is short-circuited to a ground and which is connected in shunt with the main line 2 in the vicinity of an IF signal interruption circuit 9. The line length between the grounded terminal 12 of the low-pass filter 11 and the mixer diode 3 is selected to be equal to the ½ wavelength (λif/2) of the IF signal. Other parts are the same as those of FIG. 2.

In the embodiment of FIG. 3, since the line length between the mixer diode 3 and the grounded terminal 12 is selected to be λif/2 and the IF signal interruption circuit 9 exhibits an open-circuit impedance against the IF signal, the terminal B of the mixer diode 3 is short-circuited against the IF signal. Therefore, even if the frequency of the IF signal is high, secure short-circuiting of the diode mount point is ensured. Furthermore, since the IF signal interruption circuit 9 is provided in series with the main line 2, the influence of a circuit connected on the side of the terminal 1 upon the short-circuiting state of the mount point B of the diode 3 can be removed. Since the low-pass filter 11 with its end terminal short-circuited to a ground provides a DC return for the bias current flowing through the mixer diode 3, there is no necessity of forming a further DC return circuit for the bias current. This simplifies the constitution of the mixer circuit.

FIGS. 4A and 4B show concrete constitutions of the IF signal interruption circuits 9 in the embodiments of FIGS. 2 and 3.

FIG. 4A shows an interdigital-type direct-current block, where two open-ended strip lines are parallel-coupled over a length nearly equal to a ¼ wavelength (λr/4) of the RF signal from the open end. This circuit has a simple structure, a small size and a low insertion loss for the radio frequency and exhibits band-pass filter characteristics over a wide frequency range. However, the capacitance due to a gap between two open-ended strip lines parallel-coupled is usually less than 0.1 pF when the frequency of the RF signal is 12 GHz. Even if the gap capacitance is 0.1 pF, the impedance of the gap capacitance for the IF signal of 1 GHz becomes about 1.6 kΩ, which is near the open-circuit impedance.

FIG. 4B shows a band-pass filter composed of a half wavelength strip-line resonator, where the length of the strip line is selected to be equal to the ½ wavelength (λr/2) of the RF signal. The filter passes the RF signal, but acts as an IF signal interruption circuit because the ends of the input and output transmission lines are open-circuited.

In the embodiments shown in FIGS. 2, 3 and 4A, 4B, basic circuit constitutions for realizing a microwave intergrated circuit mixer have been shown. There are various problems to be solved when practically the mixer is to be formed by a planar circuit such as a stripline or a microstrip line, etc. The main reason for this is that the quality factor Q of the planar circuit is low due to the relatively high loss of the transmission lines. In order to realize an MIC single-ended mixer with a broad bandwidth, low noise, a high intermediate frequency of GHz range and a low cost, following conditions should be satisfied.

(1) To have a filter with a low insertion loss for the RF signal but a large rejection effect on the image frequency (i.e., a frequency $f_m = 2f_e - f_r$, where $f_e$ is the LO frequency and $f_r$ is the radio frequency). These characteristics should be satisfied over a wide frequency range.

(2) The band-pass filter for the LO signal has a large rejection characteristic on both the RF and image signals.

(3) The constitution has a low noise characteristic such that the image signal generated in a mixer diode is reflected back to the diode and converted again to an IF signal.

(4) The RF signal has a low transmission loss in such a constitution that the electrical length for the RF signal between the RF signal input terminal and the mixer diode is formed as short as possible.

(5) The IF signal short-circuiting circuit which short-circuits the mount point of the mixer diode for the IF signal is realized in the GHz range.

(6) The circuit constitution is simple.

Particularly, treatment of the image signal generated in the mixer diode as well as the IF signal is important. In the case of a single-ended mixer, it leads to an improvement of efficiency to reflect the image signal back to the mixer diode by an image filter and convert it again to an IF signal.

Explanation will be made hereinafter of embodiments of low cost MIC single-ended mixers which satisfy the above-mentioned requirements with a simple constitution and enjoy both low noise and wide-band characteristics.

FIG. 5 shows another embodiment of this invention. An RF signal introduced to an RF signal input terminal 20 propagates on a main line 21 and is applied to a mixer diode 22. 23 denotes a filter which is constituted with three open-ended stubs and passes the RF signal but reflects the image frequency. The filter 23 is provided on a position where the impedance seen from a terminal C of the mixer diode 22 becomes short-circuiting at the image frequency. The length between the filter 23 and the mixer diode 22 is selected to be nearly equal to the ½ wavelength ($\lambda m/2$) of the image signal. 24 is a low-pass filter which short-circuits the terminal D of the mixer diode 22 for the RF signal, the LO signal and the image signal but passes the IF signal. 25 is an IF signal output terminal from which the IF signal generated by the mixer diode 22 is derived. 26 is an IF signal output matching circuit which is constituted in such a manner that the output impedance seen from the output terminal 25 toward the mixer diode 22 satisfies a matching condition at the intermediate frequency. Especially, this IF signal output matching circuit 26 includes an inductive shunt element 26' which also provides a DC return for the bias current flowing through the mixer diode 22. 27 is an IF signal interruption circuit which passes the RF signal but exhibits an open-circuit impedance against the IF signal, and is provided at a position relatively near the filter 23. This IF signal interruption circuit 27 is constituted with an interdigital-type direct current block where two open-ended strip lines are parallel-coupled over a length nearly equal to ¼ wavelength ($\lambda r/4$) of the RF signal from the open end. 28 is an open-ended low-pass filter (i.e., a low-pass filter having an open-circuit terminal) which is connected to the main line 21 in the vicinity of the IF signal interruption circuit 27. The length between the open-circuit terminal of this low-pass filter 28 and the mixer diode 22 is selected to be equal to the ¼ wavelength ($\lambda if/4$) of the IF signal. Therefore, the terminal C of the mixer diode 22 is short-circuited for the IF signal. The LO signal introduced to the input terminal 29 is applied to the mixer diode 22 through an LO BPF 30 constituted with a half wavelength strip line resonator. The BPF 30 is provided on a position where the impedance looked into the filter 23 from a high frequency coupling point E (i.e. a point on the main line 21 facing to a centre of a half-wavelength stripline) between the BPF 30 and the main line 21 is open-circuit impedance, or nearly so, at the frequency of the LO signal. 31 and 32 are RF signal input matching circuits which are provided in such a manner that the input impedance seen from the RF signal input terminal 20 can be matched at the radio frequency. The RF signal input matching circuit 31 is constituted with an open-ended stub while the RF signal input matching circuit 32 is constituted with a low characteristic impedance line and an open-ended stub. 33 is a DC return circuit for the bias current flowing through the mixer-diode 22 and is constituted with a low-pass filter with its end short-circuited to a ground.

In the embodiment of FIG. 5, since the filter 23 which passes the RF signal but reflects the image frequency is constituted with three open-ended stubs having a simple structure and a small size and is provided on a position where the impedance seen from the mixer diode 22 toward the filter 23 is short-circuited at the image frequency, the RF signal introduced to the RF signal input terminal 20 propagates with a low transmission loss toward the mixer diode 22 and the image frequency signal generated in the mixer diode 22 is converted again to the IF signal efficiently. Therefore, the mixer obtained has a low conversion loss and at the same time large image rejection. Furthermore, since the low-pass filter 28 is connected in shunt with the main line 21 and the line length between the open end of the open-ended low-pass filter 28 and the mixer-diode 22 is selected to be equal to the ¼ wavelength ($\lambda if/4$) of the IF signal and yet the IF signal interruption circuit 27 exhibits an open-circuit impedance against the IF signal, the mount point C of the mixer diode 22 is short-circuited at the intermediate frequency. Thus, even if the frequency of the IF signal is high as in the GHz range, the mount point C of the diode can be securely short-circuited for the IF signal. Since the circuit 27 is provided in series with the main line 21, the influence of a circuit connected on the side of the RF signal input terminal 20 upon the short-circuiting state of the mount point C of the diode can be removed. Therefore, the matching band-width for the IF signal is little influenced and low noise mixer performance is obtained over a wide bandwidth even for an IF signal of the GHz range.

Figure 6:
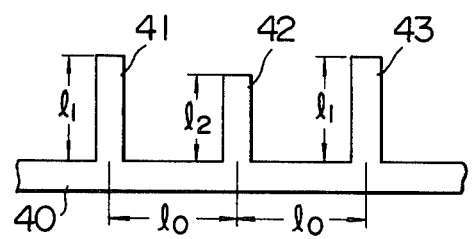
FIG. 6 is a pattern diagram of a filter formed by three open-ended stubs used in the embodiment of FIG. 5.

The constitution that the IF signal generated in the mixer diode 22 is made to pass through the low-pass filter 24 and the IF signal output matching circuit 26 including the inductive shunt element 26', which also serves as a DC return circuit for the bias current flowing through the mixer diode 22, removes the necessity of forming an independent DC return circuit for the bias current. Simple structure and small size of the filter 23 lead to miniaturization and simplification of the circuit constitution of the mixer. Moreover, since only one mixer diode is used, the manufacturing cost of the mixer becomes cheap. Furthermore, especially in the case that the intermediate frequency is low, the realization of a short-circuiting state of the diode mount point C at the intermediate frequency becomes possible by varying the electrical length of the open-ended low-pass filter 28, while keeping the line length of the main line 21 as short as possible in order to minimize the transmission loss of the main line 21 for the RF signal. FIG. 6 shows one embodiment of the constitution of the filter 23 shown in FIG. 5. It is seen that open-ended stubs 41, 42 and 43 with a length of $l_1$, $l_2$ and $l_1$, respectively, are connected in shunt with the main line 40 with a spacing of $l_0$ each other. The lengths $l_1$, $l_2$ and $l_1$ of these open-ended stubs 41, 42 and 43 are selected to be nearly equal to the ¼ wavelength ($\lambda m/4$) of the image frequency such that the poles of attenuation of the filter lie in the band of the image frequency or near the band, and that a relation $l_2 < l_1$ is satisfied. The spacing $l_0$ between the open-ended stubs 41, 42, and 43 is selected to be longer than the 5/16 wavelength (5/16 $\lambda r$) but shorter than 7/16 wavelength (7/16 $\lambda r$) of the RF signal and determined by considering the required characteristics of the filter 23 in relation to $l_1$ and $l_2$ under the condition of $l_2 < l_1 < l_0$. It is confirmed that this filter operates effectively as a filter used for a single-ended mixer when the frequency fr of the RF signal is higher than the frequency fm of the image frequency signal, i.e. $fr > fm$. For example, when open-ended stubs with a characteristic impedance 50Ω are connected in shunt with a main line of a characteristic impedance 50Ω on a dielectric substrate with a relative dielectric constant 2.5 and it is so selected that $l_0 = 6.4$ mm, $l_1 = 5.5$ mm and $l_2 = 4.8$ mm, a filter can be obtained having the input VSWR less than 1.6:1 over the frequency range of 11.7 to 13 GHz and an insertion loss greater than 30 dB over the frequency range of 8 to 10.5 GHz. This filter is effective as an image rejection filter for a single-ended mixer with the radio frequency of 12 GHz band, the intermediate frequency of 1 GHz band, the image frequency 9 GHz band and a band-width of the order of 1 GHz. Both the stop-band width and the pass-band width are greater than 1 GHz. Furthermore, the filter shown in FIG. 6 has a simple structure and a small size. Therefore, the insertion loss for the RF signal is small.

Although in the above-described embodiments the application of the LO signal to the mixer-diode 22 is made through the LO BPF parallel-coupled or gap-coupled to the main line lying between the IF signal interruption circuit and the mixer-diode, it is not always necessary to use this arrangement. For example, it is needless to say that the LO signal may be applied to the terminal 1 as well as the RF signal, or that the LO signal may be applied to the mixer diode through an LO BPF coupled to the low-pass filter 6 or 24 at the respective high frequencies.

As described above, according to this invention, an IF signal interruption circuit which passes the RF signal but presents an open-circuit impedance to the IF signal is provided on the main line; an open-ended low-pass filter, or a low-pass filter with the end terminal short-circuited to a ground is connected in the vicinity of this IF signal interruption circuit; the length between the open end of the open-ended low-pass filter and the mixer diode is selected to be equal to the ¼ wavelength of the IF signal, or in the case of the low-pass filter with the end terminal short-circuited to a ground between the grounded end terminal and the mixer-diode is selected to be equal to the ½ wavelength of the IF signal. By this constitution, the mount point of the mixer diode can be short-circuited for the IF signal. Therefore, even if the frequency of the IF signal is as high as some gigahertz, the mount point of the diode can be short-circuited securely at the intermediate frequency. Furthermore, since the IF signal interruption circuit is provided in series with the main line, the influence of a circuit connected on the side of the RF signal input terminal upon the short-circuiting state of the mount point of the diode can be removed. Therefore, the matching bandwidth for the IF signal is little limited by the condition of a circuit connected to the RF signal input terminal and low noise mixer performance can be obtained over a wide frequency range of a high intermediate frequency. Moreover, since only one mixer-diode is used in the single-ended mixer, the manufacturing cost of the mixer can be made cheap.

We claim:

1. A single-ended microwave integrated circuit strip-line or microstrip mixer, comprising a main line which connects an RF signal input terminal to one end of a mixer diode to transmit an RF signal to said mixer diode; means for applying an LO signal to said mixer diode; a first low-pass filter connected to the other end of said mixer diode for taking out an IF signal with a frequency equal to the difference between the frequencies of said RF signal and said LO signal; an IF signal interruption circuit provided in the RF signal path said main line and to pass said RF signal and provide an open-circuit impedance against said IF signal; and a second low-pass filter connected to said main line in the vicinity of said IF signal interruption circuit at a point distant from a mount point of said mixer diode to said main line for short-circuiting said IF siganl at said mount point.

2. A microwave integrated circuit mixer according to claim 1, characterized in that said second low-pass filter has an open-ended structure, and the line length between said mixer diode and the open end of said second low-pass filter is selected to be equal to the ¼ wavelength of said IF signal.

3. A microwave integrated circuit mixer according to claim 1, characterized in that said second low-pass filter has such a structure that its end terminal is short-circuited to a ground and that the line length between said mixer diode and said short-circuited end terminal of said second low-pass filter is selected to be equal to the ½ wavelength of said IF signal.

4. A microwave integrated circuit mixer according to claim 1, characterized in that said IF signal interruption circuit is constituted with an interdigital-type direct current block where two open-ended strip-lines are parallel-coupled over a length nearly equal to a ¼ wavelength of said RF signal from the open end of said open-ended strip lines.

5. A microwave integrated circuit mixer according to claim 1, characterized in that said IF signal interruption circuit is constituted with a band-pass filter consisting of at least one half-wavelength strip-line resonator where the length of said half-wavelength strip line resonator is selected to be equal to ½ wavelength of said RF signal.

6. A microwave integrated circuit mixer according to claim 1, characterized in that a further filter is connected to said main line at a position where the impedance seen from said mixer diode is short-circuiting at the frequency of an image frequency signal, said further filter being constituted with a plurality of open-ended stubs connected in shunt with said main line and exhibiting a stop-band against said image frequency signal while a pass-band at the frequency of said RF signal.

7. A microwave integrated circuit mixer according to claim 6, characterized in that said further filter is constituted with first, second and third open-ended stubs with a length of $l_1$, $l_2$ and $l_3$ respectively connected in shunt with said main line with an equal, or a nearly equal, spacing $l_0$, that the lengths $l_1$, $l_2$ and $l_3$ of said first, second and third open-ended stubs are selected to be equal to, or nearly equal to, the ¼ wavelength of said image frequency signal such that the poles of attenuation lie within the band-width of said image frequency signal or in the vicinity of the band-width of said image frequency signal, and that lengths $l_0$, $l_1$, $l_2$ and $l_3$ are selected to satisfy a condition of $l_2 < l_1 < l_0 < 2l_2$ and $l_2 < l_3 < l_0 < 2l_2$ or a condition of $l_2 < l_1 = l_3 < l_0 < 2l_2$.

8. A microwave integrated circuit mixer according to claim 7, characterized in that the spacing $l_0$ between said first, second and third open-ended stubs is selected to be longer than 5/16 wavelength of said RF signal but shorter than 7/16 wavelength of said RF signal.

9. A microwave integrated circuit mixer according to claim 1, characterized in that an IF signal output matching circuit is provided on the output side of said first low-pass filter, said IF signal output matching circuit is constituted with at least more than one inductive shunt element with its end short-circuited to a ground and at least one of said inductive shunt elements being used as a DC return circuit for the bias current flowing through said mixer diode.

* * * * *